United States Patent
Wu et al.

(10) Patent No.: US 11,994,803 B2
(45) Date of Patent: May 28, 2024

(54) PHOTORESIST REMOVER COMPOSITIONS

(71) Applicant: Merck Patent GmbH, Darmstadt (DE)

(72) Inventors: Hengpeng Wu, Hillsborough, NJ (US); Robert Arent, Clinton, NJ (US)

(73) Assignee: Merck Patent GmbH, Darmstadt (DE)

( * ) Notice: Subject to any disclaimer, the term of this patent is extended or adjusted under 35 U.S.C. 154(b) by 133 days.

(21) Appl. No.: 17/596,852

(22) PCT Filed: Jul. 9, 2020

(86) PCT No.: PCT/EP2020/069326
§ 371 (c)(1),
(2) Date: Dec. 20, 2021

(87) PCT Pub. No.: WO2021/005140
PCT Pub. Date: Jan. 14, 2021

(65) Prior Publication Data
US 2022/0276562 A1 Sep. 1, 2022

Related U.S. Application Data

(60) Provisional application No. 62/872,950, filed on Jul. 11, 2019.

(51) Int. Cl.
*B08B 3/08* (2006.01)
*B08B 3/10* (2006.01)
*G03F 7/42* (2006.01)

(52) U.S. Cl.
CPC ................ *G03F 7/426* (2013.01); *B08B 3/08* (2013.01); *B08B 3/10* (2013.01); *B08B 2203/007* (2013.01)

(58) Field of Classification Search
CPC .. G03F 7/426; B08B 3/08; B08B 3/10; B08B 2203/007
See application file for complete search history.

(56) References Cited

U.S. PATENT DOCUMENTS

| | | | |
|---|---|---|---|
| 4,511,403 A * | 4/1985 | Orio | C23C 18/31 106/1.25 |
| 5,612,303 A * | 3/1997 | Takayanagi | C09J 11/06 134/40 |
| 5,972,862 A | 10/1999 | Torii et al. | |
| 6,231,677 B1 | 5/2001 | Ishikawa et al. | |
| 6,551,973 B1 | 4/2003 | Moore | |
| 6,576,394 B1 | 6/2003 | Xu et al. | |
| 10,613,442 B2 | 4/2020 | Moore | |
| 2004/0127374 A1 * | 7/2004 | Jo | C11D 7/263 510/175 |
| 2011/0253171 A1 | 10/2011 | Moore | |
| 2012/0108486 A1 | 5/2012 | Quillen et al. | |
| 2012/0172274 A1 | 7/2012 | Mizuta et al. | |
| 2014/0076356 A1 | 3/2014 | Daviot et al. | |

FOREIGN PATENT DOCUMENTS

| | | | |
|---|---|---|---|
| EP | 0939344 A1 | 9/1999 | |
| EP | 1635224 A2 | 3/2006 | |
| EP | 1840508 A2 | 10/2007 | |
| EP | 1860508 A2 | 11/2007 | |
| EP | 2718767 B1 * | 8/2019 | ............. C23G 5/032 |
| GB | 2021285 A | 11/1979 | |
| JP | S51-72503 A | 6/1976 | |
| JP | 1-114846 A | 5/1989 | |
| JP | 2-251855 A | 10/1990 | |
| JP | 10-55993 A | 2/1998 | |
| JP | 2004-213005 A | 7/2004 | |
| JP | 2006-11433 A | 1/2006 | |
| JP | 2006-11444 A | 1/2006 | |
| JP | 2006-332082 A | 12/2006 | |
| JP | 2007-526523 A | 9/2007 | |
| JP | 2010-2580 A | 1/2010 | |
| JP | 2010-070724 A | 4/2010 | |
| KR | 2003-0069688 A | 8/2003 | |
| KR | 2007-0023004 A | 2/2007 | |
| KR | 2016-0098462 A | 8/2016 | |
| TW | 200801854 A | 1/2008 | |
| TW | 201641685 A | 12/2016 | |
| WO | 98/00244 A1 | 1/1998 | |
| WO | 99/31191 A1 | 6/1999 | |
| WO | 01/00763 A1 | 1/2001 | |
| WO | 02/23406 A1 | 3/2002 | |
| WO | 2005/085957 A1 | 9/2005 | |
| WO | WO-2009032460 A1 * | 3/2009 | ......... C11D 11/0047 |
| WO | 2011/027773 A1 | 3/2011 | |
| WO | 2012/168485 A1 | 12/2012 | |
| WO | 2013/123317 A1 | 8/2013 | |
| WO | 2016/142507 A1 | 9/2016 | |

(Continued)

OTHER PUBLICATIONS

International Search Report and Written Opinion for International Application No. PCT/EP2020/068936, dated Nov. 16, 2020, 12 pages.
International Search Report and Written Opinion for International Application No. PCT/EP2020/069326, dated Oct. 22, 2020, 10 pages.
Dammel, Ralph, "Diazonapththoquinone-based Resists", Chapter 2, Basic Chemistry of DNQ/Novolak resists, SPIE Optional Engineering Press vol. TT 11, 1993, 22 pages.
Hiroshi, Ito, "Chemical Amplification Resists for Microlithography", Advances in Polymer Science, 172, 2005, pp. 37-245.
Quillen et al., "Optimizing surface finishing processes through the use of novel solvents and systems", Proceedings vol. 6518, Metrology, Inspection, and Process Control for Microlithography XXI, Apr. 5, 2007, pp. 651841-1-651841-11.
Wallis et al., "Effect of water and lipophilic alcohols or amines on the 4-dodecylbenzenesulfonic acid-catalyzed esterifications, transesterifications, and amidations", European Journal of Lipid Science and Technology, vol. 119, No. 9, 2017, 11 pages.

(Continued)

*Primary Examiner* — Alexander Markoff
(74) *Attorney, Agent, or Firm* — Francis M. Houlihan

(57) ABSTRACT

The present invention relates to a composition including a sulfonic acid selected from the group consisting of an alkylbenzenesulfonic acid, or its hydrate, a sulfosalicyclic, or its hydrate, and mixtures thereof and the solvent dipropylene glycol dimethyl ether [CAS registry number 111109-77-4] (III).

8 Claims, No Drawings

(56) References Cited

FOREIGN PATENT DOCUMENTS

WO 2021/005140 A1 1/2021

OTHER PUBLICATIONS

Office Action received for Taiwan Patent Application No. 109123194 mailing date Jul. 17, 2023, 7 Pages (1 Pages of English Translation & 6 Pages of Official copy).
Office Action received for Korean Patent Application No. 10-2022-7003643 mailing date Aug. 3, 2023, 15 (8 Pages of English translation & 7 Pages of official copy).
Office Action received for Japanese Patent Application No. 2022-500553 mailing date Jul. 26, 2023, 5 Pages (3 Pages of English translation and 2 pages of official copy).

\* cited by examiner

PHOTORESIST REMOVER COMPOSITIONS

This application is a national stage application, filed under 35 U.S.C. § 371, of International Patent Application No. PCT/EP2020/069326 (filed on 9 Jul. 2020) which claims the benefit of U.S. Provisional Patent Application No. 62/872,950 (filed on 11 Jul. 2019) each of which applications is incorporated herein by reference in their entirety.

FIELD OF INVENTION

The present invention relates to compositions of a low $pK_a$ remover solution consisting of specific alkylbenzenesulfonic acids, sulfosalicylic acids, and the solvent dipropylene glycol dimethyl ether [CAS registry number 111109-77-4], and also compositions containing these components and a surfactant. These remover solutions show clean removal of photoresist films from substrates, showing complete dissolution of the removed resist pattern with no particle formation or deposition. Further, when the substrate is a metal such as copper or tin, the removal of the patterned resist causes little (i.e., no significant) or no corrosion of the metal substrates.

BACKGROUND

This invention relates to a chemical stripper composition that removes cross-linked polymer coatings using inventive remover compositions which do not promote corrosion of metal substrates, but which unexpectedly also do not require the presence of metal protecting chelating compounds or compound or polymers of charge complexing character to prevent significant corrosion.

Materials removed by these inventive formulations include positive tone and negative-tone chemically amplified (e.g. epoxy) and acid-catalyzed photoimageable coatings. Many commercialized strippers for microelectronic coatings do not perform sufficiently to meet minimum manufacturing requirements. The invention provides a commercial framework to create removal products for cross-linked systems that respond in acidic media without the harmful etching and damaging effects commonly observed on devices that contain metals such as copper or tin, but at the same time do not contain metal chelating compound that may deleteriously form particulate matter during the removing/stripping process.

For various processed conditions, up to and including hard-baking, or otherwise referred to as full-cure, the composition will remove, and dissolve chemically-amplified reacted compounds within minutes without damaging effects to sensitive metals such as copper or tin, using conventional immersion conditions at elevated temperatures. Such full-cure coatings are found to be resistant to conventional organic strippers that commonly comprise alkaline ingredients as exemplified in U.S. Pat. No. 6,551,973 (2003), Moore et al. When using these conventional strippers, no dissolution occurs. Instead, these conventional alkaline strippers are observed to remove the coating by mechanisms of lifting or breaking-up into pieces. This lift-off mechanism generates incomplete removal from complex three-dimensional topographies as commonly seen in microelectromechanical systems (MEMS) devices. Un-dissolved material will produce particles that are circulated throughout the bath, causing re-deposition of the un-dissolved pieces onto other areas of the device. Such contamination that occurs onto these tiny, computer controlled, gears, sensors, springs, pumps, and related micro or nanoscale fixtures results in contamination and device failure. It is an object of this invention to achieve full-dissolving of the unwanted polymer material during the given stripping and removal period.

Some low $pK_a$ systems that remove crosslinked coatings, do so by complete dissolution, rather than lift-off, however, these materials contain metal corrosion inhibitors, which unexpectedly, causes a particulate problem, due to the precipitation of these inhibitor components during the removal process. These corrosion inhibitors are metal complexing additives which are added to prevent corrosion of metal substrates, by the low $pK_a$ remover by complexing with metal substrates, during the removal process. Examples of such corrosion inhibitors are small molecules, oligomers or polymers containing a moiety of the enol variety, for instance, containing an unsaturated carbon chain adjacent to alcohol functionality. Representative enol inhibitors include fumaric, maleic, and phthalic acids. More specific examples of inhibitors are those of the rosin variety; these are, for instance, fumarated rosins. The particles formed by metal inhibitor in low $pK_a$ removers, may deposit unto other areas of the device, deleteriously affecting the performance of the final device. Non-limiting examples of such low $pK_a$ remover systems containing such metal inhibitors are described in WO2016/142507.

During the manufacture of these microcircuits or microdevices, various inorganic substrates such as single and polycrystalline silicon, hybrid semiconductors such as gallium arsenide, and metals, are coated with an organic coating ("photoresist" or "resist") which forms a resistant framework of permanent or temporary design and exhibits a pattern after undergoing a photolithographic process. The photoresist may be utilized to insulate conductors or protect selected areas of the substrate surface, such as silicon, silicon dioxide, or aluminum, from the action of chemicals in both wet (chemical) and dry (plasma) forms. In the case of the material being utilized as a photoresist, exposed areas of the substrate may carry out a desired etch (removal) or deposition (addition) process. Following completion of this operation and after subsequent rinsing or conditioning, it is necessary that the resist and any application post-etch residue be removed to permit essential finishing operations. Upon removal of the photoresist, specific micro-etched or deposited patterns are left behind. The masking and patterning processes are repeated several times to produce layered arrangements that comprise the art of the final device. Each step requires complete resist stripping and dissolving, to ensure that the final form device is produced at relatively high yields and performs satisfactorily. The deposition of any particles during this process into active area deleteriously affects both the yield and performance of devices.

It is an object of this invention to provide an improved stripping composition that will remove a wide range of different patterned photoresist film including ones formed from different types of both negative and positive resist systems. Of these different types, examples are resists which are imageable by visible light, broadband i-line, g-line, h-line, UV, 248 nm, 193 nm, 193 nm immersion, deep UV, EUV, electron or e-beam. Depending of which type is employed these materials may contain additives such as photo-active compounds (e.g. DNQ), photo-acid generators (PAG), and photoradical generators, which may be prone to particle formation. Consequently, it is also an objective that the invention be able to remove patterns formed from these types of resists, giving complete dissolution in minutes, rather than hours, of all components, resins and additives, without particle formation. It is also an object of this invention to conduct such photoresist removal from substrates without attack to underlying exposed copper and/or tin as well as other metals, without the use of metal corrosion inhibitor additives as such additives may be prone to also promote particle formation during the removal of the resist pattern. It is a further object to conduct this photoresist pattern removal and metal protection by utilizing a safe and non-regulated chemistry that does not produce harm to workers, or to the environment, and avoids the use of solvents with low flash point, especially those whose boiling points are below about 150° C.

The current inventive remover compositions impart these advantageous properties by completely dissolving the photoresist pattern, from patterns formed from many different types of resist, without forming lifted-off resist film or particles resulting from either resins or additives. At the same time, unexpectedly, these inventive remover compositions in the solvent dipropylene glycol dimethyl ether [CAS registry number 111109-77-4], containing a low $pK_a$ component, for instance DBSA (dodecylbenzenesulfonic acid) and/or 5-sulfosalicylic acid, do not require the presence of any inhibitor additive to suppress corrosion (no significant corrosion), or to give no corrosion of metal substrate such as copper, tin and the like. Consequently, there is no problem associated with the precipitation of metal corrosion inhibitor during the removal process using these inventive compositions. These inventive remover compositions, and processes of use thereof, have been found to be especially useful in the manufacture of semiconductor wafers, MEMS devices, and displays. Further, these inventive remover compositions have the following advantages, (1) no need for anti-corrosion agents; (2) dissolve photoresist film instead of just delaminate it; (3) all ingredients are water soluble (most anti-corrosion agents used in prior arts are water insoluble), and therefore only requires water rinsing; (4), no protective layer on substrates formed when anti-corrosion agents are used; and (5) employ an environmentally benign solvent.

SUMMARY OF THE INVENTION

In one of its aspects, the present invention relates to a composition consisting essentially of a sulfonic acid selected from the group consisting of an alkylbenzenesulfonic acid having structure (I), or its hydrate, a sulfosalicylic acid having structure (II), or its hydrate, and mixtures thereof, wherein n is an integer from 6 to 16, and the solvent dipropylene glycol dimethyl ether [CAS registry number 111109-77-4] (III). In a further aspect, the present invention relates to a composition consisting of a sulfonic acid selected from the group consisting of an alkylbenzenesulfonic acid having structure (I), or its hydrate, a sulfosalicylic acid having structure (II), or its hydrate, and mixtures thereof, wherein n is an integer from 6 to 16, and the solvent dipropylene glycol dimethyl ether [CAS registry number 111109-77-4] (III).

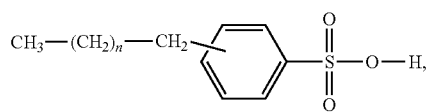
(I)

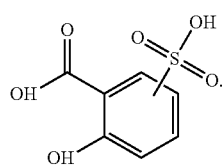
(II)

In another aspect, the present invention relates to a composition consisting essentially of (I), (II), (III), and a surfactant. In a further aspect, the present invention relates to a composition consisting of (I), (II), (III), and a surfactant.

Finally, this invention also relates to using the above compositions to remove a photoresist film from a substrate.

DETAILED DESCRIPTION

It is to be understood that both the foregoing general description and the following detailed description are illustrative and explanatory, and are not restrictive of the subject matter, as claimed. In this application, the use of the singular includes the plural, the word "a" or "an" means "at least one", and the use of "or" means "and/or", unless specifically stated otherwise. Furthermore, the use of the term "including", as well as other forms such as "includes" and "included", is not limiting. Also, terms such as "element" or "component" encompass both elements and components comprising one unit and elements or components that comprise more than one unit, unless specifically stated otherwise. As used herein, the conjunction "and" is intended to be inclusive and the conjunction "or" is not intended to be exclusive unless otherwise indicated. For example, the phrase "or, alternatively" is intended to be exclusive. As used herein, the term "and/or" refers to any combination of the foregoing elements including using a single element.

The term (meth)acrylate is a term which embodies in one term both acrylate and methacrylate.

The terms "stripper" and "remover" are synonymous.

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature citations and similar materials defines a term in a manner that contradicts the definition of that term in this application, this application controls.

When referring to compositions in terms of wt %, it is understood that in no event shall the wt % of all components, including non-essential components, such as impurities, add to more than 100 wt %. The composition of all essential components may add up to less than 100 wt % in those instances wherein the composition contains some small amount of a non-essential contaminants or impurities. Otherwise, if no significant non-essential impurity component is present, it is understood that the composition of all essential components will essentially add up to 100 wt %.

Some embodiments, of the inventive composition consist essentially of a sulfonic acid selected from the group consisting of an alkylbenzenesulfonic acid having structure (I) or its hydrate, a sulfosalicylic acid having structure (II) or its hydrate, and mixtures thereof, wherein n is an integer from 6 to 16, and the solvent dipropylene glycol dimethyl ether (III) [CAS registry number 111109-77-4] in varying concentration, where structures (I) and (II) include the substructures, (Ia) (Ib), (Ic), (II), (IIa), (IIb), (IIc), and (IId), respectively, described herein, in varying concentration; in such this embodiment, the combined amounts of the above components do not have to equal 100% by weight (e.g., the constituents can form at least 90 wt %, more preferably at least 95 wt %, more preferably at least 99 wt %, more preferably at least 99.5 wt %, most preferably at least 99.9 wt %), and can include other ingredients that do not material affect the performance of the remover.

Some embodiments of the inventive compositions, consist essentially of, a sulfonic acid selected from the group consisting of an alkylbenzenesulfonic acid having structure (I) or its hydrate, a sulfosalicylic acid having structure (II) or its hydrate, and mixtures thereof, wherein n is an integer from 6 to 16, and the solvent dipropylene glycol dimethyl ether (III) [CAS registry number 111109-77-4] in varying concentration, where structures (I) and (II) include the substructures, (Ia) (Ib), (Ic), (II), (IIa), (IIb), (IIc), and (IId), respectively, and a surfactant as described herein, in varying concentration; in this embodiment, the combined amounts of the above components do not have to equal 100% by weight (e.g., the constituents can form at least 90 wt %, more preferably at least 95 wt %, more preferably at least 99 wt % of the composition, more preferably at least 99.5 wt %, most preferably at least 99.9 wt %), and can include other ingredients that do not material affect the performance of the remover. In some of these embodiments, when the surfactant is further defined, as a surfactant corresponding to structure (VI) or (VIa), preferably no further surfactants different from these structures are present in the composition.

Materials which do not affect the performance of the remover, such as non-acidic impurities, free water [in addition to what is introduced when using a hydrate of structures (I) and/or (II) and their corresponding substructures (Ia) (Ib), (Ic), (II), (IIa), (IIc), and (IId)], may be present at these level under the definition of "consisting essentially of," namely in one embodiment up to about 10 wt %, preferably up to about 5 wt %, more preferably up to about 1 wt %, more preferably up to 0.5 wt %, and most preferably up to 0.1 wt %.

A variety of materials can materially change the effectiveness of the compositions as a remover and are excluded from the inventive compositions described herein. Examples of these excluded materials are particles, pigment, dyes, antioxidants, and inhibitors of the rosin variety; such as, fumarated rosins and other materials which can form particles and deposit on the substrate during stripping. Also excluded are any other types of acidic materials, which can deleteriously affect the resist stripping and/or corrosivity towards metal of the inventive stripping compositions. For example other types of sulfonic acids, other than those which are present in the inventive compositions described herein, having structures (I) and or (II) (and substructures (Ia) (Ib), (Ic), and/or (IIa), (IIb), (IIc), (IId)], which can affect the resist stripping and/or corrosivity towards metal of the inventive stripping compositions; non-limiting examples of such other types of sulfonic acid are, alkylsulfonic acids (e.g. methanesulfonic acid, butanesulfonic acid), triflic acid, perfluoroalkylsulfonic acid (e.g. perfluorobutanesulfonic acid), partially fluorinatedalkylsulfonic acid (e.g. 2,2,2-trifluoroethanesulfonic acid), other arylsulfonic acids (substituted or unsubstituted e.g. benzenesulfonic acid, fluorobenzenesulfonic acids, di-fluorobenzenesulfonic acid, pentafluorobenzenesulfonic acid, alkylbenzenesulfonic acids where the alkyl group has less than 8 carbons (e.g. tosic acid, 4-ethylbenzenesulfonic acid, propylbenzenesulfonic acid), nitrobenzenesulfonic acids, dinitrobenzesufonic acids, benzenedisulfonic acids, and the like and the like. Also excluded are sulfamic acids such as the non-limiting examples sulfamic acid, cyclamic acid, and methysulfamic acid. Also excluded are strong inorganic acids ($pK_a$ less than 0) such as the non-limiting examples, fluorosulfonic acid, nitric acid, sulfuric acid, hydrochloric acid and the like. Inorganic acids with a $pK_a$ more than 0, hydrofluoric acid, phosphorus oxoacids containing P in oxidation state +1 [ e.g. $H_3PO_2$ (or $H_2PO(OH)$), hypophosphorous acid or phosphinic acid, a monoprotic acid]; phosphorus oxoacids containing P in oxidation state +3 [e.g. ($H_3PO_3$ (or $HPO(OH)_2$), phosphorous acid or phosphonic acid, a diprotic acid], Phosphorus oxoacids containing P in oxidation state +5 (e.g. Phosphoric acid:$H_3PO_4$ (or $PO(OH)_3$), Phosphoric acid, a tribasic acid phosphoric acid). Also excluded are carboxylic acid such as the the non-limiting examples of formic acid, alkylcarboxylic acids (e.g. acetic acid, propanoic acid and the like), perfluoroalkylcarboxylic acids (e.g. trifluoroacetic acid and the like), arylcarboxylic acids (e.g. benzoic acid and the like), alkylbenzenecarboxylic acids (e.g. toluic acid and the like), arylalkylenecarboxylic acid (e.g. phenylacetic acid, phenylpropanoic acid and the like), dicarboxylic acids (e.g. oxalic acid, maleic acid, malonic acid and the like), tricarboxylic acids (e.g. citric acid, isocitric acid, aconitic acid, propane-1,2,3-tricaboxylic acid, trimesic acid and the like). Also excluded are all other solvents [apart from the inventive solvent component (III), dipropylene glycol dimethyl ether [CAS registry number 111109-77-4]], which promote corrosion of metals (e.g. copper and/or tin, and/or other metal substrates and bimetallic substrates described herein with a special emphasis on substrates containing tin). Specific non-limiting examples of such excluded solvents are polar aprotic solvents, dialkylsulfoxides, and solvents having structures (Is), (IIs), (IIIs), (IVs), (Vs), (VIs), (VIIs), (VIIIs), (IXs), (Xs), (Xis), and (XIIs), wherein $R_s$ is selected from the group consisting of $-(-O-CH_2-CH_2-)_{ns}-OH$, $-OH$, $-O-C(=O)-CH_3$, wherein ns is equal to 1, or 2, $R_{s1}$ is H or a C-1 to C-4 alkyl moiety, and $R_{s2}$ is a C-1 to C-18 alkyl.

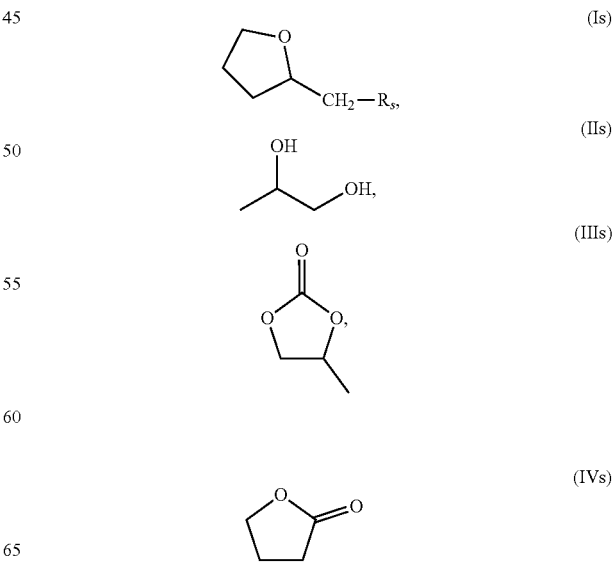

Dipropylene glycol monomethyl ether (Vs) [CAS #34590-94-8], (VIs)

(VIIs)

(VIIIs)

(IXs)

(Xs)

(XIs)

(XIIs)

The solvent excluded from the inventive composition, described above, under the terms "dipropylene glycol monomethyl ether (VIs) (DPGME)," is a mixture of isomeric compounds which has CAS #34590-94-8. This mixture has general formula is $(CH_3O)C_3H_6OC_3H_6(OH)$. This mixture also has the synonymous name dipropylene glycol methyl ether. Dipropylene glycol monomethyl ether, comprises the following isomeric compounds: 1-(2-methoxypropoxy)-2-propanol (CAS 13429-07-7) (VIsa); 1-(2-methoxy-1-methylethoxy)-2-propanol (CAS 20324-32-7) (VIsb), 2-(2-methoxypropoxy)-1-propanol (CAS 13588-28-8)(VIsc); 2-(2-(2-methoxypropoxy)-1-propanol (CAS 55956-21-3) (VIsd), having the following structures and their individual optical isomers; these individual solvent components of dipropylene glycol monomethyl ether (VIsa to VIsd), and their optical isomers are also excluded as individual components in the inventive compositions:

(VIsa)

(VIsb)

(VIsc)

(VIsd)

According to one embodiment of the invention, the term "consisting essentially of" can be replaced by "consisting of" by allowing for no further components in the composition. For instance, in the inventive compositions described herein, not containing a surfactant component, the combined amounts of the alkylbenzenesulfonic acid having structure (I) or its hydrate, a sulfosalicylic acid having structure (II) or its hydrate, and mixtures thereof, wherein n is an integer from 6 to 16, and the solvent dipropylene glycol dimethyl ether (III) [CAS registry number 111109-77-4] in varying concentration, where structures (I) and (II) include the substructures, (Ia) (Ib), (Ic), (II), (IIa), (IIb), (IIc), and (IId), respectively; the combined amounts of the above components equal approximately about 100% by weight, allowing for the presence of impurities. Similarly, in the inventive compositions described herein, containing a surfactant component, the combined amounts of the alkylbenzenesulfonic acid having structure (I) or its hydrate, a sulfosalicylic acid having structure (II) or its hydrate, and mixtures thereof, wherein n is an integer from 6 to 16, the solvent dipropylene glycol dimethyl ether (III) [CAS registry number 111109-77-4] in varying concentration, where structures (I) and (II) include the substructures, (Ia) (Ib), (Ic), (II), (IIa), (IIb), (IIc), and (IId), respectively, and a surfactant the combined amounts of the above components have to equal approximately about 100% by weight, allowing for the presence of impurities.

In one of its aspects, the present invention relates to a composition consisting essentially of a sulfonic acid selected from the group consisting of an alkylbenzenesulfonic acid having structure (I), or its hydrate, a sulfosalicylic acid having structure (II), or its hydrate, and mixtures thereof, wherein n is an integer from 6 to 16, and the solvent dipropylene glycol dimethyl ether [CAS registry number 111109-77-4] (III). In a further aspect, the present invention relates to a composition consisting of a sulfonic acid selected from the group consisting of an alkylbenzenesulfonic acid having structure (I), or its hydrate, a sulfosalicylic acid having structure (II), or its hydrate, and mixtures thereof, wherein n is an integer from 6 to 16, and the solvent dipropylene glycol dimethyl ether [CAS registry number 111109-77-4] (III).

(I)

(II)

In another aspect of the present invention it relates to a composition consisting essentially of (I), (II), (III), and a surfactant. In a further aspect, the present invention relates to a composition consisting of (I), (II), (III), and a surfactant.

In all embodiment of the inventive compositions described herein, the solvent designated by dipropylene glycol dimethyl ether, the number (III) or the abbreviation DPGDME, is a complex mixture of isomeric compounds which has CAS #111109-77-4. This mixture has the general formula is $CH_3OC_3H_6OC_3H_6OCH_3$. This mixture also has the synonymous name oxybis[methoxypropane], DMFG, dipropylene glycol dimethyl ether, Proglyde™, DMM, Proglyme™. This mixture comprises the following isomeric compounds: 2-methoxy-1-(2-methoxypropoxy)propane (CAS #63019-84-1) (IIIa); 2-methoxy-1-((1-methoxypropan-2-yl)oxy)propane (CAS 89399-28-0) (IIIb), 2-methoxy-1-((1-methoxypropan-2-yl)oxy)propane (CAS #189354-80-1) (IIIc), having the following general structures (IIIa, IIIb, IIIc), which because these structures contain optical active carbon, are also are mixtures of enantiomer and diastereomers resulting the optical activity of these carbons:

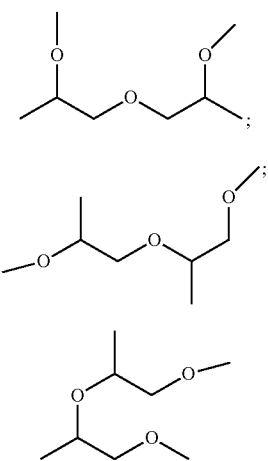

In the embodiment of the inventive composition described herein, containing a surfactant, there is no particular restriction with regard to the surfactant, and the examples of it include a polyoxyethylene alkyl ether such as polyoxyethylene lauryl ether, decaethylene glycol mono-dodecyl ether, polyoxyethylene stearyl ether, polyoxyethylene cetyl ether, and polyoxyethylene olein ether; a polyoxyethylene alkylaryl ether such as polyoxyethylene octylphenol ether and polyoxyethylene nonylphenol ether; a polyoxyethylene polyoxypropylene block copolymer; a sorbitane fatty acid ester such as sorbitane monolaurate, sorbitane monovalmitate, and sorbitane monostearate; a nonionic surfactant of a polyoxyethylene sorbitane fatty acid ester such as polyoxyethylene sorbitane monolaurate, polyoxyethylene sorbitane monopalmitate, polyoxyethylene sorbitane monostearate, polyethylene sorbitane trioleate, and polyoxyethylene sorbitane tristearate; a fluorinated surfactant such as F-Top EF301, EF303, and EF352 (manufactured by Jemco Inc.), Megafac F171, F172, F173, R08, R30, R90, and R94 (manufactured by Dainippon Ink & Chemicals, Inc.), Florad® FC-430, FC-431, FC-4430, and FC-4432 (manufactured by Sumitomo 3M Ltd.), Asahi Guard AG710, Surflon S-381, S-382, S-386, SC101, SC102, SC103, SC104, SC105, SC106, Surfinol® E1004, KH-10, KH-20, KH-30, and KH-40 (manufactured by Asahi Glass Co., Ltd.); an organosiloxane polymer such as KP-341, X-70-092, and X-70-093 (manufactured by Shin-Etsu Chemical Co., Ltd.); and an acrylic acid or a methacrylic acid polymer such as Polyflow™ No. 75 and No. 95 (manufactured by Kyoeisha Yushikagaku Kogyo K. K.).

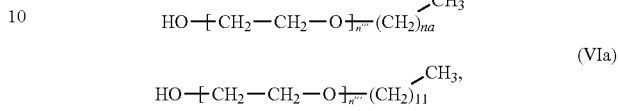

In another embodiment of the aforementioned inventive compositions the surfactant is present in an amount that is less than 1 wt % of the total weight of the composition. In another embodiment, the surfactant is present in an amount that is less than about 0.1 wt %.

In another embodiment of any of the above compositions the surfactant is a polymeric surfactant having structure (VI), wherein n''' is the number of, repeat units in the polymer and na is the number of $CH_2$ spacer moieties, which is an integer from 8 to 14. In another embodiment of this aspect of the composition said polymeric surfactant has structure (VIa).

In embodiments of this invention containing a surfactant having structure (VI) or (VIa) each may individually be present in the composition from about 0.005 wt % to about 0.100 wt %. In another embodiment from about 0.010 wt % to about 0.050 wt %. In yet another embodiment from about 0.015 wt % to about 0.040 wt %. In still another embodiment from about 0.020 wt % to about 0.035 wt %. In yet another embodiment from about 0.022 wt % to about 0.030 wt %. In still another embodiment from about 0.023 wt % to about 0.028 wt %. In yet another embodiment from about 0.024 wt % to about 0.026 wt %. In still another embodiment about 0.025 wt %.

In another embodiment of any of the above compositions the alkylbenzenesulfonic acid of structure (I) n is an integer from 8 to 16. In another aspect of this embodiment, n is an integer from 8 to 14. In yet another embodiment of this aspect, n is an integer from 8 to 10. In yet another embodiment, n is an integer from 6 to 10.

In one embodiment of the above described compositions, the sulfonic acid component is only an alkylbenzenesulfonic acid of structure (I), or its hydrate.

In another embodiment of the above described compositions, the sulfonic acid component is only a sulfosalicylic acid of structure (II), or its hydrate.

In another embodiment of the above described compositions, the sulfonic acid component is a mixture of an alkylbenzenesulfonic acid of structure (I), or its hydrate, and a sulfosalicylic acid of structure (II), or its hydrate.

In embodiments of the composition described herein which have as one of its components an alkylbenzenesulfonic acid of structure (I) (or its hydrate), in one more specific embodiment, this sulfonic acid is one having the more specific structure (Ia).

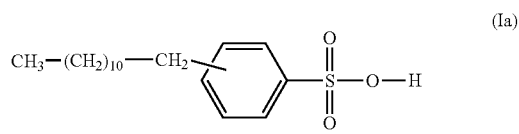

In embodiments of the composition described herein which have as one of its components an alkylbenzenesulfonic acid of structure (I) (or its hydrate), in more specific embodiments of these, n is an integer from 6 to 16, and this acid has the more specific structure (Ib), wherein nb is an integer from 6 to 16. In a more specific aspect of this embodiment nb is an integer from 10 to 14. In yet another aspect of this embodiment nb is an integer from 8 to 10. In still another embodiment of this aspect it has the more specific structure (Ic).

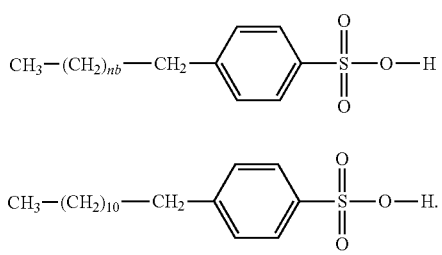

In embodiments of the composition described herein which have as one of its components an alkylbenzenesulfonic acid of structure (I) (or its hydrate), in more specific embodiments of these, n is an integer from 8 to 16. In another aspect n is an integer from 8 to 14. In yet another aspect, n is an integer from 8 to 10. In any of the above described ranges, the alkylbenzenesulfonic acid may be one having structure (Ia).

In embodiments of the composition described herein which have as one of its components a sulfosalicylic acid of structure (II) (or its hydrate), more specific embodiments of these, are selected from ones having structures (IIa), (IIb), (IIc), (IId) (or its hydrate) and mixtures thereof.

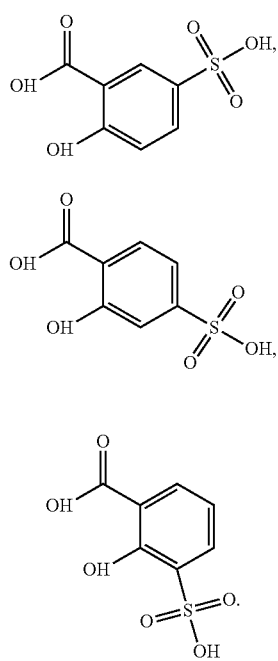

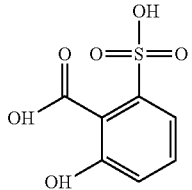

In some embodiments the sulfosalicylic acid of structure (II) (or its hydrate) is a compound having structure (IIa) (or its hydrate).

In some embodiments the sulfosalicylic acid of structure (II) (or its hydrate) is a compound having structure (IIb) (or its hydrate).

In some embodiments the sulfosalicylic acid of structure (II) (or its hydrate) is a compound having structure (IIc) (or its hydrate).

In some embodiments the sulfosalicylic acid of structure (II) (or its hydrate) is a compound having structure (IId) (or its hydrate).

In another embodiment of any of the above aspects of this composition, the sulfonic acid component, it is one having structure (I) (or is hydrate) and it has a wt % loading in the total wt of the solution ranging from about 0.5 wt % to about 10 wt %. In another aspect of this embodiment the wt % loading of this acid is from about 0.75 wt % to about 7.00 wt %. In another aspect of this embodiment the wt % loading of this acid is from about 1.00 wt % to about 6.00 wt %. In another aspect of this embodiment the wt % is from about 1.50 wt % to about 5.00 wt %. In another aspect of this embodiment the wt % is from about 1.50 wt % to about 4.00 wt %. In another aspect of this embodiment the wt % is from about 1.75 wt % to about 3.00 wt %. In another aspect of this embodiment the wt % is from about 1.80 wt % to about 2.75 wt %. In another aspect of this embodiment the wt % is from about 1.90 wt % to about 2.50 wt %. In another aspect of this embodiment the wt % is from about 1.90 wt % to about 2.30 wt %. In another aspect of this embodiment the wt % is from about 1.90 wt % to about 2.20 wt %. In another aspect of this embodiment the wt % is about 2 wt %.

In another embodiment of any of the above aspects of this composition, the sulfonic acid component, it is one having structure (Ib) (or is hydrate) and it has a wt % loading in the total wt of the solution ranging from about 0.5 wt % to about 10 wt %. In another aspect of this embodiment the wt % loading of this acid is from about 0.75 wt % to about 7.00 wt %. In another aspect of this embodiment the wt % loading of this acid is from about 1.00 wt % to about 6.00 wt %. In another aspect of this embodiment the wt % is from about 1.50 wt % to about 5.00 wt %. In another aspect of this embodiment the wt % is from about 1.50 wt % to about 4.00 wt %. In another aspect of this embodiment the wt % is from about 1.75 wt % to about 3.00 wt %. In another aspect of this embodiment the wt % is from about 1.80 wt % to about 2.75 wt %. In another aspect of this embodiment the wt % is from about 1.90 wt % to about 2.50 wt %. In another aspect of this embodiment the wt % is from about 1.90 wt % to about 2.30 wt %. In another aspect of this embodiment the wt % is from about 1.90 wt % to about 2.20 wt %. In another aspect of this embodiment the wt % is about 2 wt %. In another aspect of this embodiment, the alkylbenzenesulfonic acid may be one having structure (Ic).

In another embodiment of any of the above aspects of this composition, the sulfonic acid component is one having structure (II) (or is hydrate) and it has a wt % loading in the total wt of the solution ranging from about 0.5 wt % to about 10 wt %. In another aspect of this embodiment the wt % loading of this acid is from about 0.75 wt % to about 7.00 wt %. In another aspect of this embodiment the wt % loading of this acid is from about 1.00 wt % to about 6.00 wt %. In another aspect of this embodiment the wt % is from about 1.50 wt % to about 5.00 wt %. In another aspect of this embodiment the wt % is from about 1.50 wt % to about 4.00 wt %. In another aspect of this embodiment the wt % is from about 1.75 wt % to about 3.00 wt %. In another aspect of this embodiment the wt % is from about 1.80 wt % to about 2.75 wt %. In another aspect of this embodiment the wt % is from about 1.90 wt % to about 2.50 wt %. In another aspect of this embodiment the wt % is from about 1.90 wt % to about 2.30 wt %. In another aspect of this embodiment the wt % is from about 1.90 wt % to about 2.20 wt %. In another aspect of this embodiment the wt % is about 2 wt %. In another aspect of this embodiment the sulfonic acid component is one having structure (IIa).

In another embodiment of any of the above aspects of this composition, the sulfonic acid component is a mixture of the ones having structure (I) and (II) (or their hydrate) and it has a wt % loading in the total wt of the solution ranging from about 0.5 wt % to about 10 wt %. In another aspect of this embodiment the wt % loading of this acid is from about 0.75 wt % to about 7.00 wt %. In another aspect of this embodiment the wt % loading of this acid is from about 1.00 wt % to about 6.00 wt %. In another aspect of this embodiment the wt % is from about 1.50 wt % to about 5.00 wt %. In another aspect of this embodiment the wt % is from about 1.50 wt % to about 4.00 wt %. In another aspect of this embodiment the wt % is from about 1.75 wt % to about 3.00 wt %. In another aspect of this embodiment the wt % is from about 1.80 wt % to about 2.75 wt %. In another aspect of this embodiment the wt % is from about 1.90 wt % to about 2.50 wt %. In another aspect of this embodiment the wt % is from about 1.90 wt % to about 2.30 wt %. In another aspect of this embodiment the wt % is from about 1.90 wt % to about 2.20 wt %. In another aspect of this embodiment the wt % is about 2 wt %. In another aspect of this embodiment the sulfonic acid component a mixture of ones having structures (Ib) and (IIa) (or their hydrates), wherein nb is an integer from 8 to 16. In another aspect of this embodiment the sulfonic acid component a mixture of ones having structures (Ib) and (IIa) (or their hydrates) in which nb is an integer from 8 to 14. In yet another embodiment the sulfonic acid having structure (Ib) in said mixture of sulfonic acid is wherein nb is an integer from 8 to 10. In another aspect of this embodiment the sulfonic acid component a mixture of ones having structures (Ic) and (IIa) (or their hydrates).

In any of the above embodiments of this composition wherein the sulfonic acid component is a mixture of the ones having structure (I) and (II) (or their hydrates), or a mixture of these sulfonic having the more specific structures (Ib) and (IIa), the weight ratio of the ones having structure (I) (or Ic) to ones having structure II (or IIa) ranges from about 100:1 to about 1:1. In a more specific example this ratio ranges from about 10:1 to about 1:1. In a yet more specific example the ratio ranges from about 5:1 to about 1:1.

Another embodiment of this invention is a process comprising the steps;
i) heating any one of the above described inventive compositions at a temperature which is from about 20° C. to about 100° C., forming a heated composition;
ii) treating a substrate coated with a photoresist film with said heated composition for a time from about 1 minutes to about 60 minutes, until a substrate with a removed photoresist film, results,
iii) after step ii), rinsing said substrate with a removed photoresist film with either isopropyl alcohol, water or a mixture of isopropyl alcohol and water to remove any residual composition from step ii), producing a clean substrate,
iv) drying said clean substrate.

In one embodiment of the above inventive process, said treating of said photoresist film which is removed in said step ii) is one which is selected from the group consisting of a patterned photoresist film, a blanket exposed photoresist film having no pattern, and an unexposed photoresist film. In one embodiment it is a patterned photoresist film. In another embodiment it is an unexposed photoresist film. In another embodiment it is a blanket exposed photoresist film.

In one embodiment of the above inventive process, in step ii) said treating is done by by either dipping it into said heated inventive composition, spraying with said heated inventive composition or by puddling said heated composition onto said photoresist film. In one aspect of this embodiment, dipping is used. In another aspect of this embodiment spraying is used. In another aspect of this embodiment puddling is used.

In another embodiment of the above inventive process in step i), the composition is heated from about 30° C. to about 65° C.

In another embodiment of the above inventive process in step iv), said clean substrate is dried by either spin drying in air, using a stream of gas such as nitrogen, air, or some other inert gas, isopropyl alcohol (IPA) drying, or Marangoni Drying. In one aspect said drying is done by spin drying, In another aspect said drying is done by using said a stream of gas. In another aspect said drying is done by using IPA drying. In yet another aspect said drying is done by said Marangoni drying.

In one aspect of the above inventive process said photoresist film is a negative photoresist film.

In one aspect of the above inventive process said photoresist film is a positive photoresist film.

In another aspect of the any of the above inventive process said photoresist film is a chemically amplified photoresist film.

In another aspect of any of the above embodiment said photoresist film is a patterned negative photoresist film or a blanket exposed negative photoresist film. In one aspect it is a patterned negative photoresist film. In another aspect it is a blanket exposed negative photoresist film. In one aspect of these embodiment said negative photoresist is a chemically amplified photoresist.

A patterned photoresist film as described herein refers to a photoresist film which has been exposed and developed with either an aqueous base developer or a solvent based developer to produced said patterned, said development may occur after a post-exposure bake depending on the type photoresist used to form the film.

A blanket exposed photoresist film refers to a photoresist film which has been exposed to radiation (i-line, g-line, UV, deep UV, broadband, EUV, e-beam and the like), but where no mask was used during the exposure to produce an exposed pattern, which upon development would produce a patterned photoresist film.

In another embodiment of the above inventive process in step ii) the substrate is a metal. In one aspect of this embodiment the metal is selected from aluminum, aluminum/copper alloys, copper, tin, titanium, tungsten and nickel. In another aspect of this embodiment of the process, the metal is selected from aluminum, aluminum/copper alloys, and copper. In still another embodiment of the above inventive process in step ii) the substrate is copper. In still another embodiment of the above inventive process in step ii), the substrate is tin.

In still another embodiment of the above inventive process in step ii) the substrate is substrate containing a bimetallic pattern which is comprised of two different metals selected from aluminum, aluminum/copper alloys, tin and copper. In one aspect said bimetallic patter is one of copper and tin.

In another embodiment of the above inventive process in step ii) the substrate is treated for about 1 minute to about 20 minutes. In another aspect of this embodiment in step ii) the substrate is treated for about 5 minutes to about 20 minutes.

In another embodiment of the above inventive process in step iii) the rinse is done with water.

The inventive remover composition may be used in the above inventive process to remove patterns from many different types of photoresist patterns as follows.

The inventive remover may be used to remove patterned resist films having a variety of thicknesses depending on the application, IC devices, IC devices interconnect, circuit board, solder board application, MEM, dispay and the like. Typically, the thickness tracts with the size of the device being manufactured starting from about tens of nanometers for state of the art IC, to the several microns range for larger IC devices, to 10 to 500 microns for very large devices such as MEM's.

The removers of the present disclosure can be used with resist pattern which arise from negative and positive photoresist material capable of forming patterns which may be selected from ones which may form patterns using different types of radiation. For instance, as non-limiting examples resist patterns for removal may be formed from i-line photoresists, g-line photoresists 248 nm photoresists, 193 nm photoresist, extreme ultraviolet photoresists, electron beam photoresists and particle beam photoresists. The removers of the present disclosure can be used with photoresist patterns may arise from photoresists which may be further classified as follows by the type of chemistry which is employed to obtain the pattern.

For instance, the removers of the present inventive compositions may be used to remove positive pattern resulting from, exposure by visible, i-line, h-line, and g-line and development by aqueous base employ of photoresists based upon a Novolak resin and a diazonaphthoquinone type sensitizer (DNQ) sensitizer material, these types of resist system may also yield negative images through a tone reversal process. Diazonapthoquinone-Novolak based resists are described in (Diazonapththoquinone-based Resists, Chapter 2, Basic Chemistry of DNQ/Novolak resists, SPIE Optional Engineering Press volume TT 11, page 9, 1993), which are hereby incorporated by reference in its entirety.

Also, the removers of the present inventive compositions can be used to remove resist films and patterns resulting from both negative or positive photoresist which are developable by either aqueous base or solvent.

Also, the removers of the present inventive compositions can be used to remove resist which are chemically amplified and aqueous base developable. Typically, resist patterns are formed by 248 nm, 193 nm, EUV to enable higher resolutions patterns, but resist patterns may also be produced using longer wavelengths, such as visible, broadband UV, i-line, g-line, and h-line.

The removers of the present disclosure can be used to remove resist patterns resulting from positive tone chemically amplified resists, resins which are latently aqueous base soluble, such as (meth)acrylate copolymers, styrenic copolymer, Novolaks, phenolic resins, are rendered aqueous base soluble by deprotecting acid cleavable group which mask aqueous base solubilizing moieties. The base solubilizing moieties may be carboxylic acids, phenols, or other moieties having typically a $pK_a$ below 11 such that aqueous base will largely ionize them. The acid is generated in exposed areas of the photoresist film by a photoacid generating compound. This acid deprotects the acid cleavable group through a process of acidolysis, or hydrolysis, releasing a free base solubilizing moieties, allowing, in exposed areas for the photoresist film to be aqueous base soluble.

The removers of the present disclosure can be used to remove resist patterns resulting from negative tone chemically amplified, whose inherent aqueous base solubility is not masked by any protecting group. Rather, in this approach, an inherently base soluble resin (binder resin) such as ones based on aqueous base soluble (meth)acrylate copolymers, styrenic copolymer, Novolaks, and the like are crosslinked catalytically by photo-acid through acid crosslinking moieties. These moieties may be pendent to the binder resins themselves, present on crosslinking additives (crosslinking agents) or present on both the resins and the additives. Acid catalyzed crosslinking in exposed areas is affected through a photo-acid generated by a PAG, which results, after aqueous base development in a negative tone image. Typically, when a crosslinking additive is employed it is a moiety capable of forming a carbonium ion upon interaction with the photoacid such as an aminoplast, or an additive containing acid crosslinkable group such as an epoxy compound. Similarly, if the crosslinking moiety is present on the resin it may either be a moiety capable of forming a carbonium ion with acid, or a moiety which can undergo crosslinking with an acid such as an epoxy moiety. The following reference is a review of chemically amplified resist: H. Ito, Adv Polym Sci 2005 I72 p. 37.

The removers of the present disclosure can be used to remove resist patterns resulting from negative chemically amplified resist may result from negative chemically amplified resists, where the binder resins may comprise a Novolak, for instance ones derived from a substituted phenol such as ortho-cresol; meta-cresol; para-cresol; 2,4-xylenol; 2,5-xylenol; 3,4-xylenol, 3,5-xylenol, thymol and mixtures thereof, that has been condensed with an aldehyde such as formaldehyde. In other approaches, the binder resin may also comprise a poly(vinyl phenol) such as a poly(para-hydroxystyrene); a poly(para-hydroxy-alpha-methylstyrene; a copolymer of para-hydroxystyrene or para-hydroxy-alpha-methylstyrene and styrene, acetoxystyrene or acrylic acid and/or methacrylic acid; a hydroxyphenylalkyl carbinol homopolymer; or a Novolak/poly(vinyl phenol) copolymer. The crosslinking additives, for such negative chemically amplified resist, may be etherified aminoplast crosslinking functionalities containing within a small compound, an organic oligomer, or a polymer. Such aminoplasts, provide a carbonium ion, upon acid cleavage, and serves to crosslink the binder resin in the presence of an acid generated by radiation, preferably imaging radiation. This crosslinking renders the binder resin insoluble in an alkaline medium, in the exposed areas. Such crosslinking agents may be prepared from a variety of aminoplasts in combination with a compound or low molecular weight polymer containing a plurality of hydroxyl, carboxyl, amide or imide groups. Some examples of amino oligomers or polymers are aminoplasts obtained by the reaction of an amine, such as urea, melamine, or glycolurea with an aldehyde, such as formaldehyde. Suitable aminoplasts may include urea-formaldehyde, melamine-formaldehyde, benzoguanamine-formaldehyde, and gylcoluril-formaldehyde resins, and combinations of any of these. In some applications, the aminoplast is a hexa(methoxymethyl) melamine oligomer. A non-limiting example of such materials is described in U.S. Pat. No. 6,576,394.

The removers of the present disclosure can be used with negative resist patterns for use with the inventive low $pK_a$ remover compositions and processes described above, may result from negative crosslinking resists which are based upon crosslinking initiated by a photoradical generator, instead of a photoacid generator. In this instance, the same type of binder resins may be employed as described above for the chemically amplified negative photoresists. However, in this instance a crosslinking additive is present which comprises at least two olefinic moiety, which is easily susceptible to radical crosslinking. Examples of such moieties are, vinyl aryl moieties such as styrenes, and acrylate or methacrylate moieties. Non-limiting, more specific examples of these radical crosslinking additive can be appropriately selected, depending on the purposes, from acrylic acid derivatives such as acrylic acid esters and methacrylic acid derivatives such as methacrylic acid esters. These may have a low molecular weight (monomer property) or a high molecular weight (oligomer or polymer property). In this instance, the additive may be small molecule, an oligomer or a polymer which contain multiple radical crosslinkable moieties. Some of these radical crosslinking additives may have structures within them which are acid cleavable. Such structures may be of use during further processing of the patterned film, for instance in facilitating stripping of the resist after pattern transfer into the substrate. Examples of such acid cleavable groups are tertiary ethers, tertiary carboxylates, and the like which are susceptible to acidolytic cleavage without advantageous water, or alternatively acid cleavable moieties which may readily undergo complete hydrolytic cleavage with photo-acid advantageous water in the resist film such as acetal, ketals, and alkyl silyl ethers. A non-limiting example of such materials is described in U.S. Pat. No. 7,601,482.

EXAMPLES

Reference will now be made to more specific embodiments of the present disclosure and experimental results that provide support for such embodiments. However, Applicants note that the disclosure below is for illustrative purposes only and is not intended to limit the scope of the claimed subject matter in any way.

Chemicals

DBSA (dodecylbenzenesulfonic acid; CAS: 68584-22-5) was obtained from Stepan (22 West Frontage Rd., Northfield, IL 60093). All other chemicals were purchased from Sigma Aldrich (3050 Spruce St., St. Louis, MO 63103).

Processing

Silicon 200 mm (8") wafers with 150 nm copper sputter coating were used for copper corrosion testing. A copper coated silicon wafer coupon was immersed in a preheated photoresist remover solution for a time of periods that were more than enough to strip a photoresist. Regular inspection was done to check the condition of the metal surface by visual and microscopic inspection for the presence of surface haze as indicative of corrosion. Surface haze can be identified and confirmed at levels more sensitive than gravimetric analysis (<10 Å/min).

For tin corrosion testing, a similar procedure to copper corrosion testing was used except a silicon wafer with a 1000 Å thermal oxide layer covered by 500 Å of titanium with 5000 Å layer of tin on top was used.

For photoresist stripping tests, unless otherwise stated, silicon wafers with 150 nm sputtered copper were used as the substrate upon which a chemically amplified negative photoresist AZ®-15nXT (a product of EMD Performance Materials, Branchburg, NJ 08876) was applied and processed. The processing consisted of spin coating the resist to a 12 μm thickness and applying a soft bake on a hotplate at 110° C. for 180 sec. The resist was then exposed to 900 mJ/cm$^2$ of light through a contact hole patterned mask. A post-exposure bake was completed on a hotplate at 120° C. for 60 seconds before developing the resist. Development used AZ® 300 MIF Developer in two puddles of 60 seconds each followed by a rinse with deionized water ("DI") water.

Copper Corrosion and Photoresist Stripping Test 1

A photoresist remover solution was prepared by dissolving 2 wt % DBSA in dipropylene glycol dimethyl ether (CAS #111109-77-4). The solution was heated on a hotplate to 60° C. in a 150 ml beaker with a magnetic stirring bar (300 rpm). A copper wafer coupon was immersed in the heated solution for 30 minutes. The copper surface was free of haze and essentially intact by visual and microscopic inspections.

The same composition, temperature and setup were used to remove photoimaged AZ®-15 nXT photoresist patterns. The crosslinked photoresist patterns were dissolved within 5 minutes. Further the substrate was free of any particles after rinsed with DI water for 1 minute and blown dry with a nitrogen gun.

Copper Corrosion and Photoresist Stripping Test 2

A photoresist remover solution was prepared by dissolving 1 wt % DBSA and 1 wt % 5-sulfosalicylic acid dihydrate (CAS: 5965-83-3) in dipropylene glycol dimethyl ether (CAS: 111109-77-4). The solution was heated on a hotplate to 65° C. in a 150 ml beaker with a magnetic stirring bar (300 rpm). A copper wafer coupon was immersed in the heated solution for 30 minutes. The copper surface was free of haze and essentially intact by visual and microscopic inspections.

The same composition, temperature and setup were used to remove photoimaged AZ®-15 nXT photoresist patterns. The crosslinked photoresist patterns were dissolved within 5 minutes. Further, the substrate was free of any particles after rinsed with DI water for 1 minute and blown dry with a nitrogen gun.

Copper Corrosion and Photoresist Stripping Test 3

A photoresist remover solution was prepared by dissolving 2 wt % 5-sulfosalicylic acid dihydrate (CAS: 5965-83-3) in dipropylene glycol dimethyl ether (CAS: 111109-77-4). The solution was heated on a hotplate to 60° C. in a 150 ml beaker with a magnetic stirring bar (300 rpm). A copper wafer coupon was immersed in the heated solution for 30 minutes. The copper surface was free of haze and essentially intact by visual and microscopic inspections.

The same composition, temperature and setup were used to remove photoimaged AZ®-15 nXT photoresist patterns. The crosslinked photoresist patterns were dissolved within 5 minutes. Further the substrate was free of any particles after rinsed with DI water for 1 minute and blown dry with a nitrogen gun.

Tin Corrosion and Photoresist Stripping Test 1

A photoresist remover solution was prepared by dissolving 2 wt % DBSA in dipropylene glycol dimethyl ether (CAS #111109-77-4). The solution was heated on a hotplate to 60° C. in a 150 ml beaker with a magnetic stirring bar (300 rpm). A tin wafer coupon was immersed in the heated solution for 30 minutes. The tin surface was free of haze and essentially intact by visual and microscopic inspections.

The same composition, temperature and setup were used to remove photoimaged AZ®-15 nXT photoresist patterns. The crosslinked photoresist patterns were dissolved within 5 minutes. Further the substrate was free of any particles after rinsed with DI water for 1 minute and blown dry with a nitrogen gun.

The above tests demonstrate that strong benzenesulfonic acids without anti-corrosion agents do not corrode copper or tin when formulated in the chosen solvent and the compositions were effective to strip a chemically amplified negative photoresist. The following comparative examples will show that such acids when formulated in different solvents will corrode copper or tin.

Comparative Copper Corrosion Test 1

A photoresist remover solution was prepared by dissolving 2 wt % DBSA in dipropylene glycol monomethyl ether (CAS: 34590-94-8). The solution was heated on a hotplate to 60° C. in a 150 ml beaker with a magnetic stirring bar (300 rpm). A copper wafer coupon was immersed in the heated solution. After 5 minutes, the copper layer on silicon wafer turned hazy indicating corrosion.

Comparative Tin Corrosion Test 1

A photoresist remover composition was prepared by dissolving 2 wt % DBSA in tetraglycol (CAS#31692-85-0). The solution was heated on a hotplate to 60° C. in a 150 mL beaker with a magnetic stirring bar (300 rpm). A coupon was created from a silicon wafer with a 1000 Å thermal oxide layer covered by 500 Å of titanium with 5000 Å layer of tin on top. This coupon was immersed in the heated solution for 30 minutes. The tin surface was no longer intact by visual inspection due to the high etch-rate of the chemistry.

Additional Metal Etch Rate Tests 1

A photoresist remover solution was prepared by dissolving 2 wt % DBSA in dipropylene glycol dimethyl ether (CAS: 111109-77-4). Using a hot plate 100 ml of the solution was heated to 60° C. in a 250 ml beaker with a magnetic stirring bar (300 rpm). Wafer coupons with a blanket layer of various metals were immersed in the solution for 30 and 60 minutes. Film thicknesses of the metal layers were measured using a Jandel 4 Point Probe. Film thicknesses were measured at times of 0 (before immersion), 30 minutes, and 60 minutes. Plots were made of film thickness vs. time. A linear regression was made to the data. The slope of the linear regression is the measured etch rate value as shown in the following table. The results showed that the photoresist remover composition has low etch on both copper and tin.

TABLE 1

| Temp | Film (Etch Rates in Å/min) | |
| --- | --- | --- |
| (° C.) | Cu | Sn |
| 60 | 1.69 | <1 |

Additional Metal Etch Rate Tests 2

A photoresist remover solution was prepared by dissolving 1 wt % DBSA and 1 wt % 5-sulfosalicylic acid dihydrate (CAS: 5965-83-3) in dipropylene glycol dimethyl ether (CAS: 111109-77-4). Using a hot plate, 100 ml of the solution was heated to 60° C. in a 250 ml beaker with a magnetic stirring bar (300 rpm). Wafer coupons with a blanket layer of various metals were immersed in the solution for 30 and 60 minutes. Film thicknesses of the metal layers were measured using a Jandel 4 Point Probe. Film thicknesses were measured at times of 0 (before immersion), 30 minutes, and 60 minutes. Plots were made of film thickness vs. time. A linear regression was made to the data. The slope of the linear regression is the measured etch rate value as shown in the following table. The results showed that the photoresist remover composition has low etch on both copper and tin.

TABLE 2

| Temp | Film (Etch Rates in Å/min) | |
| --- | --- | --- |
| (° C.) | Cu | Sn |
| 60 | 2.7 | <1 |

The above tests demonstrate that strong benzenesulfonic acids without anti-corrosion agents do not corrode copper or tin when formulated in the chosen solvent and the compositions were effective to strip a chemically amplified negative photoresist. The above comparative examples showed that remover formulations containing dodecylbenzenesulfonic acid, 5-sulfosalicylic acid or mixtures of these in a solvent other than dipropylene glycol dimethyl ether corrode copper or tin or both. Unexpectedly, the remover formulations containing dodecylbenzenesulfonic acid, 5-sulfosalicylic acid or mixtures of these in dipropylene glycol dimethyl ether effectively cleanly removes photoresist coatings on substrates containing copper or tin without the formation of resist lift-off or corrosion of the copper or tin in this substrate.

We claim:

1. A composition consisting essentially of
a sulfosalicyclic acid having structure (II), or its hydrate, and the solvent dipropylene glycol dimethyl ether (III),

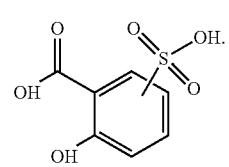

(II)

2. A process comprising the steps:
i) heating the composition according to claim 1, at a temperature which is from about 20° C. to about 100° C.,
ii) treating a substrate coated with a photoresist film with said heated composition for a time from about 1 minutes to about 60 minutes, until a substrate with a removed photoresist film, results,
iii) after step ii), rinsing said substrate with a removed photoresist film with either isopropyl alcohol, water or a mixture of isopropyl alcohol and water to remove any residual composition from step ii), producing a clean substrate,
iv) drying said clean substrate.

3. The process of claim 2, wherein in step i) the composition is heated from about 30° C. to about 65° C.

4. The process of claim 2, wherein in step ii), the substrate is a metal.

5. The process of claim 4, wherein in step ii), the substrate is copper.

6. The process of claim 4, wherein in step ii), the substrate is tin.

7. The process of claim 2, wherein in step ii), the substrate is treated for about 1 minutes to about 20 minutes.

8. The process of claim 2, wherein in step iii) the rinse is done with water.

\* \* \* \* \*